United States Patent
Chen (10) Patent No.: US 10,636,997 B2
(45) Date of Patent: Apr. 28, 2020

(54) DISPLAY PANEL AND DISPLAY DEVICE

(71) Applicant: WuHan TianMa Micro-Electronics Co., Ltd., Wuhan (CN)

(72) Inventor: Fei Chen, Wuhan (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 0 days.

(21) Appl. No.: 16/184,004

(22) Filed: Nov. 8, 2018

(65) Prior Publication Data

US 2019/0393443 A1   Dec. 26, 2019

(30) Foreign Application Priority Data

Jun. 22, 2018   (CN) .......................... 2018 1 0654376

(51) Int. Cl.
*H01L 51/52* (2006.01)
*H01L 27/32* (2006.01)
*H01L 51/00* (2006.01)

(52) U.S. Cl.
CPC ...... *H01L 51/5246* (2013.01); *H01L 27/3279* (2013.01); *H01L 51/0097* (2013.01); *H01L 2251/301* (2013.01); *H01L 2251/5338* (2013.01); *H01L 2251/558* (2013.01)

(58) Field of Classification Search
CPC ....... H01L 2251/5338; H01L 2251/301; H01L 51/0097; H01L 2227/32; H04M 1/0268; H01M 10/3972; H05K 7/20954; H05K 2201/05; H05K 3/4691; H01F 1/117; H01F 1/375; H01G 9/2095
See application file for complete search history.

(56) References Cited

U.S. PATENT DOCUMENTS

2018/0269261 A1* 9/2018 Park ...................... G06F 3/0412

FOREIGN PATENT DOCUMENTS

CN            105470280 A      4/2016

* cited by examiner

Primary Examiner — Hsien Ming Lee
(74) Attorney, Agent, or Firm — Tarolli, Sundheim, Covell & Tummino LLP (57) ABSTRACT

A display panel and a display device are provided. The display panel includes a base substrate; a power signal line over the base substrate; an inorganic contact layer over the power signal line; a signal connection layer over the inorganic contact layer; a first electrode over the signal connection layer; and a flexible encapsulation layer comprising a first inorganic layer over the first electrode, wherein the signal connection layer is connected to the power signal line and the first electrode, the signal connection layer comprises a plurality of through holes and the first inorganic layer contacts the inorganic contact layer through the plurality of through holes. Therefore, it is possible to increase contact force between the first inorganic layer and the display panel and enhance the encapsulation effect.

14 Claims, 5 Drawing Sheets

DISPLAY PANEL AND DISPLAY DEVICE

CROSS-REFERENCE TO RELATED APPLICATIONS

The present disclosure claims priority to Chinese Patent Application No. 201810654376.2, filed on Jun. 22, 2018, the content of which is incorporated herein by reference in its entirety.

TECHNICAL FIELD

The present disclosure relates to the field of display technologies, and particularly, to a display panel and a display device.

BACKGROUND

Flexible display panels have earned more and more attention due to their light, thin and bendable characteristics. Flexible folding is also a focus of research in the field of display technologies. The existing flexible display panels use a flexible thin film encapsulation (TFB) technology in which an inorganic layer and an organic layer are formed on the display panel by vapor deposition and inkjet printing, respectively. A foldable display panel is generally subjected to multiple times of bending during use. In the repeated bending process, the flexible encapsulation layer has a risk of being peeled off due to an insufficient contact adhesion between the encapsulation layer and the display panel, further causing an encapsulation failure. The display panel will suffer abnormal display due to influence of moisture and oxygen in the air.

SUMMARY

In view of the above, the present disclosure provides a display panel to solve the above technical problems.

In a first aspect of the present disclosure, a display panel is provided. The display panel includes a base substrate; a power signal line over the base substrate; an inorganic contact layer over the power signal line; a signal connection layer over the inorganic contact layer; a first electrode over the signal connection layer; and a flexible encapsulation layer comprising a first inorganic layer over the first electrode, wherein the signal connection layer is connected to the power signal line and the first electrode, the signal connection layer comprises a plurality of through holes and the first inorganic layer contacts the inorganic contact layer through the plurality of through holes.

In a second aspect of the present disclosure, a display device is provided. The display device includes any one of the display panels provided in the present disclosure.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relation.

It should be understood that although the terms 'first', 'second' and 'third' may be used in the present disclosure to describe electrodes, these electrodes should not be limited to these terms. These terms are used only to distinguish the electrodes from one another. For example, without departing from the scope of the embodiments of the present disclosure, a first electrode may also be referred to as a second electrode. Similarly, the second electrode may also be referred to as the first electrode.

Figure 1:
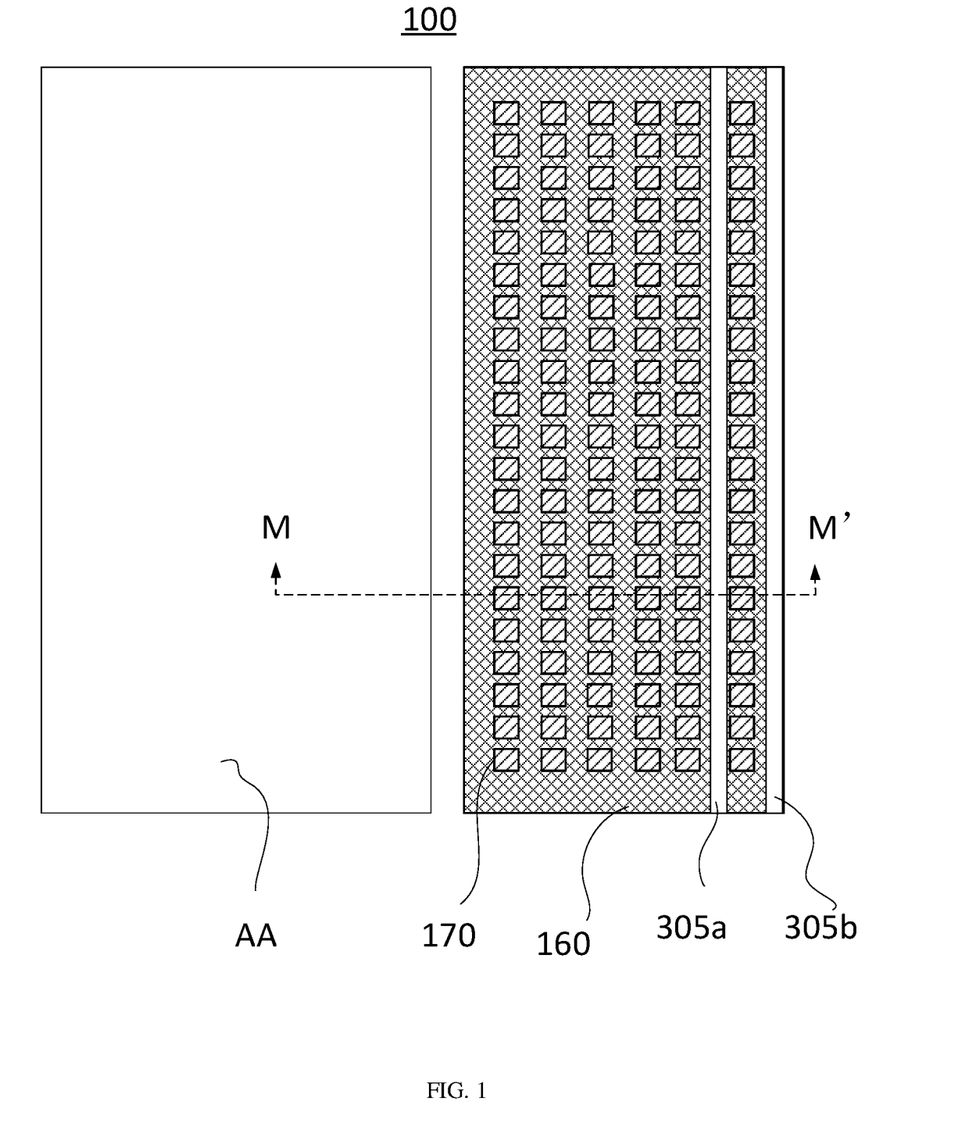
FIG. 1 is a schematic diagram showing a display panel according to an embodiment of the present disclosure.
Figure 2:
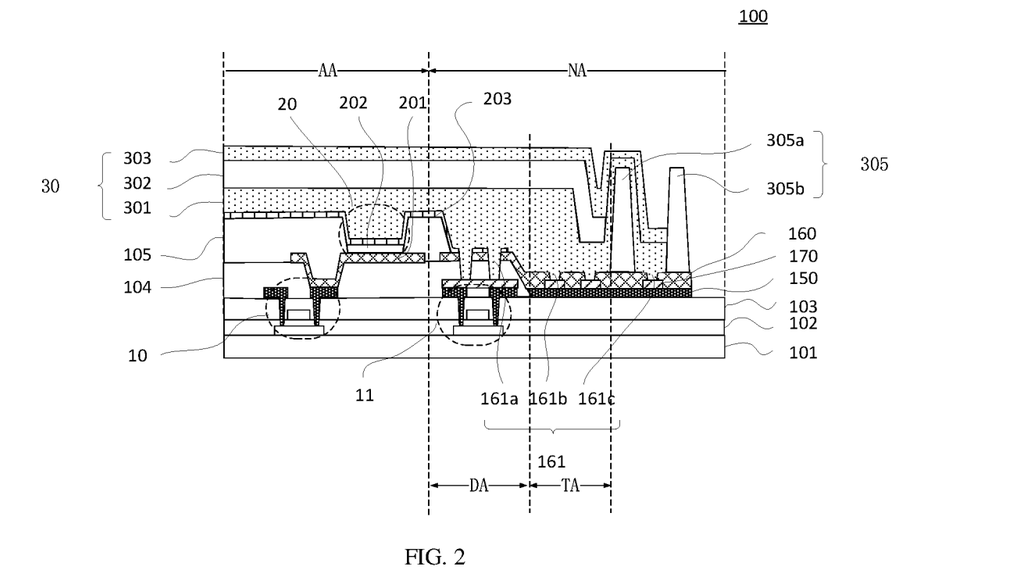
FIG. 2 is a schematic diagram showing a cross-section MM' of the display panel according to an embodiment of the present disclosure shown in FIG. 1.

Referring to FIGS. 1-2, FIG. 1 is a schematic diagram showing a display panel according to an embodiment of the present disclosure; and FIG. 2 is a schematic diagram showing a cross-section MM' of the display panel according to an embodiment of the present disclosure in FIG. 1. The display panel according to the present disclosure includes a base substrate 101, and a flexible encapsulation layer 30 arranged on the base substrate. The flexible encapsulation layer 30 at least includes a first inorganic layer 301 arranged on a side of a second electrode 201 away from the base substrate 101. The first inorganic layer 301 herein refers to an inorganic layer at a side of the flexible encapsulation layer 30 closest to the base substrate. The display panel further includes a power signal line 150, a signal connection layer 160, and a first electrode 203 sequentially arranged on the base substrate 101. The signal connection layer 160 is connected to the power signal line 150 and the first electrode 203.

The display panel 100 further includes an inorganic contact layer 170 arranged between the signal connection layer 160 and the power signal line 150. The signal connection layer 160 includes a plurality of through holes 161. The first inorganic layer 301 is in contact with the inorganic contact layer 170 through the plurality of through holes 161.

When the inorganic contact layer and the plurality of through holes are not provided, the first inorganic layer is in contact with the signal connection layer, and the material of the signal connection layer is a conductive material, generally a metal or a metal oxide, which has a relatively weak adhesion to the inorganic material, so that the contact effect is not good.

The present disclosure provides the inorganic contact layer and a plurality of through holes on the signal connection layer 160 so that the first inorganic layer for encapsulation is in contact with the inorganic contact layer through the plurality of through holes. Therefore, a "pinning" contact is formed, the contact force between the first inorganic layer and the display panel is increased, and the encapsulation effect is enhanced, thereby reducing the risk of peeling off of the first inorganic layer during the flexible bending process.

In addition, in the present disclosure, a plurality of through holes and an inorganic contact layer are arranged so that the first inorganic layer is in contact with the inorganic contact layer through the plurality of through holes. Therefore, an inorganic-inorganic contact effect is formed, greatly increasing the contact force and reducing the possible risk of peeling off of the first inorganic layer caused by the repeated bending of the foldable display panel.

Referring to FIGS. 1-2, the display panel according to the present disclosure is an OLED display panel. The display panel further includes a display unit 20. The display unit 20 includes a second electrode 201, a first electrode 203, and a light-emitting layer 202 located between the first electrode 203 and the second electrode 201. The signal connection layer 160 and the second electrode 201 are arranged in a same layer and made of a same material. It should be noted that the second electrode 201 may be an arrangement of three layers of ITO/Ag/ITO. The arrangement of a same layer and the same material in the present disclosure may be applied to three layers, any two layers or one layer in the signal connection layer, which is not limited in the present disclosure.

The display panel includes a display region AA and a non-display region NA arranged surrounding the display region. The power signal line 150 and the signal connection layer 160 are located in the non-display region NA. The display panel further includes a drive circuit 11. The power signal line 150 and one of the metal layers in the drive circuit 11 are arranged in a same layer and made of a same material. The drive circuit generally includes a transistor and a capacitor. The metal layers of the transistor include a gate metal layer and a source/drain metal layer. One electrode of the capacitor may be arranged in the same layer as the gate metal layer, and the other electrode may be arranged in a separate capacitor metal layer. Therefore, the metal layers of the drive circuit typically include a gate metal layer, and a source/drain metal layer, and a capacitor metal layer. In an embodiment, optionally, the power signal line 150 and the source/drain metal layer are arranged in a same layer and made of a same material. In addition, the arrangement of a same layer and the same material in the present disclosure in the present disclosure refers to simultaneous deposition using a same process, exposure using a same mask, and development etching in a same process.

In a typical top-emission OLED display panel, a pixel drive circuit 10 is generally included to provide a driving current and is connected to the second electrode 201. In the embodiments of the present disclosure, for example, the second electrode is an anode, and the first electrode is a cathode. The first electrode provides a cathode potential to the common electrode so that the OLED emits light. The cathode potential is usually supplied to the display region of the display panel through the power signal lines in the left and right frames of the display panel.

The cathode is usually prepared by an evaporation process, and the precision of evaporation boundary is not high. A drive circuit 11 is also included surrounding the display panel. Therefore, the width of the power signal line 150 is limited, and since the boundary precision of the cathode is not high, there is a possibility that the cathode is not lapped on the power signal line, causing failure of the display panel. The signal connection layer 160 according to the present disclosure is arranged in a same layer as the second electrode 201 so as not to occupy the film layer in the drive circuit 11, which can overlap with the drive circuit 11, and has a large width, thereby ensuring that the cathode is evaporated on the signal connection layer 160 to ensure electrical connection of the cathode.

Referring to FIGS. 1-2, in order to achieve optimized contact effect between the first inorganic layer 301 and the inorganic contact layer 170, it is preferable to set the contact area to the maximum. However, the inorganic contact layer according to the present disclosure is an insulation layer. Since the cathode signal must be transmitted from the power signal line 150 to the signal connection layer 160, the inorganic contact layer cannot cover the interface between the entire power signal line 150 and the signal connection layer 160. In the present disclosure, the inorganic contact layer is arranged as a plurality of isolate-island structures, and each of the plurality of isolate-island structures covers one of the through holes 161. Therefore, the power signal line 150 and the signal connection layer 160 can be electrically connected at the periphery of the isolate-island structure, so that the lower contact resistance is ensured, and the voltage drop is reduced while the adhesion between the flexible encapsulation layer and the display panel is achieved. It should be noted that the isolate-island structure refers to a plurality of inorganic contact layers being separately arranged, which looks like isolated islands and thus has a shape of isolate-island.

Referring to FIG. 2, in an embodiment of the present disclosure, the display panel further includes a drive circuit region DA between located the power signal line 150 and the display region AA. The signal connection layer 160 includes a first region overlapping with the drive circuit region DA. The first region is provided with a plurality of first through holes 161a through which the first inorganic layer 301 is in contact with the inorganic contact layer. The drive circuit includes a plurality of transistors. The display panel includes an active layer, a gate insulation layer 102, a gate electrode, an interlayer insulation layer 103, a source/drain electrode, an inorganic contact layer, a planarization layer 104, a second electrode 201 and a pixel definition layer sequentially arranged on the base substrate 101.

In the drive circuit region, a planarization layer 104 is further arranged between the inorganic contact layer 170 and the signal connection layer 160. The first through hole 161a passes through the signal connection layer 160 and the planarization layer 104 so that the first inorganic layer 301 is in contact with the inorganic contact layer 170. This arrangement makes the hole to be deeper and the "pinning" effect is better. Moreover, the position of the contact hole is arranged in the drive circuit region, which does not additionally occupy the space of the frame and is beneficial to achieving the narrow frame.

Referring to FIG. 2, in an embodiment of the present disclosure, the display panel includes a first bank 305, and the first inorganic layer 301 covers at least a portion of the first bank 305.

A transition region TA is arranged between the first bank 305 and the drive circuit 11. The transition region is mainly used to arrange the power signal line 150. The signal connection layer 160 includes a second region overlapping with the transition region TA. A plurality of second through holes 161b is arranged in the second region. The first inorganic layer 301 is in contact with the inorganic contact layer 170 through the plurality of second through holes 161b. In an embodiment, the width of the second region can be up to 150 micrometers, so that sufficient space for forming the plurality of second through holes 161b can be ensured, the contact force between the first inorganic layer 301 and the inorganic contact layer 170 is ensured, and peeling off of the flexible encapsulation layer caused by repeated bending is avoided.

Referring to FIG. 2, in an embodiment of the present disclosure, the first bank 305 includes a first sub-bank 305a and a second sub-bank 305b. A gap region is provided between the first sub-bank 305a and the second sub-bank 305b. The signal connection layer 160 includes a third region overlapping with the gap region. The third region is provided with a plurality of third through holes 161c. The first inorganic layer 301 is in contact with the inorganic contact layer 170 through the plurality of third through holes 161c.

In an embodiment, the flexible encapsulation layer may include a first inorganic layer 301, a second inorganic layer 303, and an organic layer 302 arranged between the first inorganic layer 301 and the second inorganic layer 303. The inorganic layer mainly serves to form a dense layer which can block moisture and oxygen from damaging the organic light-emitting material. The organic layer mainly serves to achieve planarization and stress release. The first sub-bank 305a in an embodiment is mainly used for blocking the organic layer, and the second sub-bank 305b is mainly used for blocking the inorganic layer. A width of 30 micrometers or more is provided between the first sub-bank 305a and the second sub-bank 305b, which is sufficient to form a through hole. Therefore, in an embodiment, the third through hole is designed so that the first inorganic layer 301 is in contact with the inorganic contact layer 170, thereby increasing the adhesion of the interface and reducing the risk of peeling off of the flexible encapsulation layer.

In addition, if the signal connection layer does not extend between the first sub-bank and the second sub-bank, the inorganic contact layer may be arranged in the gap region so that the first inorganic layer 301 and the inorganic contact layer 170 are directly in contact, instead of contacting through the through hole, thereby ensuring a large contact area and good contact effect.

In an embodiment of the present disclosure, the first inorganic layer 301 includes one or more of silicon nitride, silicon oxide, and silicon oxynitride; and the inorganic contact layer 170 includes one or more of silicon nitride, silicon oxide, silicon oxynitride. In this way, the materials of the first inorganic layer 301 and the inorganic contact layer 170 are similar, so that the interface contact between the first inorganic layer 301 and the inorganic contact layer 170 is more sufficient, the adhesion is better, and peeling off of the flexible encapsulation layer is less likely to occur.

Figure 3:
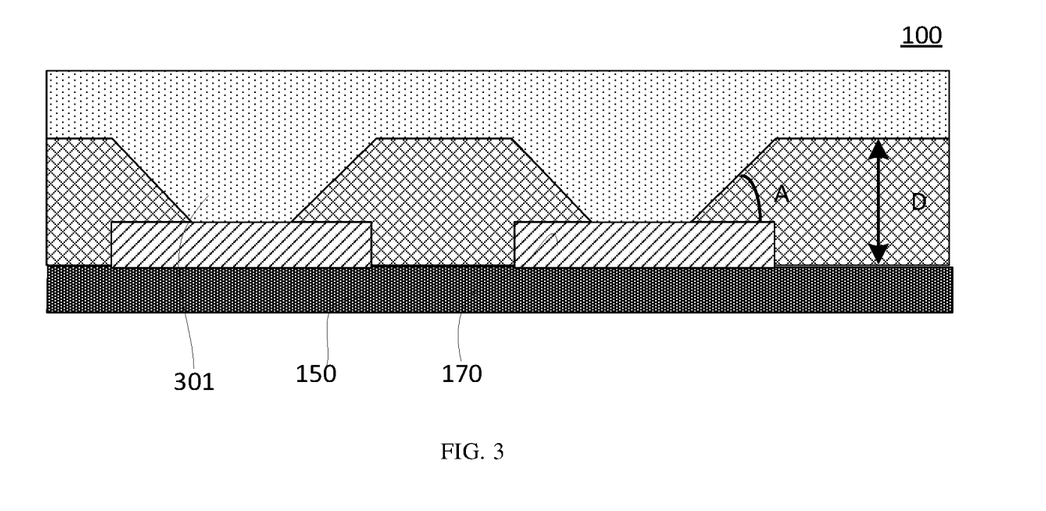
FIG. 3 is a partial enlarged diagram showing a display panel according to an embodiment of the present disclosure.

Referring to FIG. 3, FIG. 3 is a partial enlarged view of a through hole according to an embodiment of the present disclosure. The first inorganic layer 301 is generally formed using a CVD (chemical vapor deposition) process, and the inorganic material is fragile and is prone to fracture. When a thicker and steeper boundary is encountered, it is easy to form a large section difference and thus the inorganic layer is fractured, and then the encapsulation is ineffective. Therefore, in the present disclosure, the thickness D of the signal connection layer 160 is set to be smaller than 40 nm. In this way, the section difference of the first inorganic layer 301 may be smaller than 40 nm, thereby fracture of first inorganic layer is avoided. It should be noted that the signal connection layer 160 and the second electrode 201 may be arranged in a same layer and made of a same material. The second electrode 201 may be an arrangement of three layers of ITO/Ag/ITO. The signal connection layer may include three layers, two layers, or one layer. Here, the expression "the thickness of the signal connection layer described herein is smaller than 40 nm" means that a total thickness of the signal connection layer is smaller than 40 nm.

Due to a too steep interface, fracture of the inorganic layer is also easily formed. Therefore, in the present disclosure, the inclination angle A of the through hole is defined to be smaller than 75° with respect to a top surface of the inorganic contact layer 170, so that the interface is relatively planar, and a large section difference may not occur in a short distance, thereby reducing the risk of fracture of the first inorganic layer 301. It should be noted that the signal connection layer 160 and the second electrode 201 may be arranged in a same layer and made of a same material, and the second electrode 201 may be three layers of ITO/Ag/ITO. However, if an etch rate is not well controlled, etch rates of ITO and Ag are not the same. If the etch rate of ITO is relatively fast and the etch rate of Ag is relatively slow, the intermediate Ag may form a protrusion, causing fracture of the inorganic layer. If the etch rate of Ag is relatively fast and the etch rate of ITO is relatively slow, a recess may be formed in the middle so that the first inorganic layer falls into the recess to form a fracture. Therefore, in the embodiments of the present disclosure, only one of ITO and Ag may be included. Alternatively, only one layer of ITO and one layer of Ag may be included. In this way, the above situation and the fracture of the first inorganic layer can be avoided.

Figure 4:
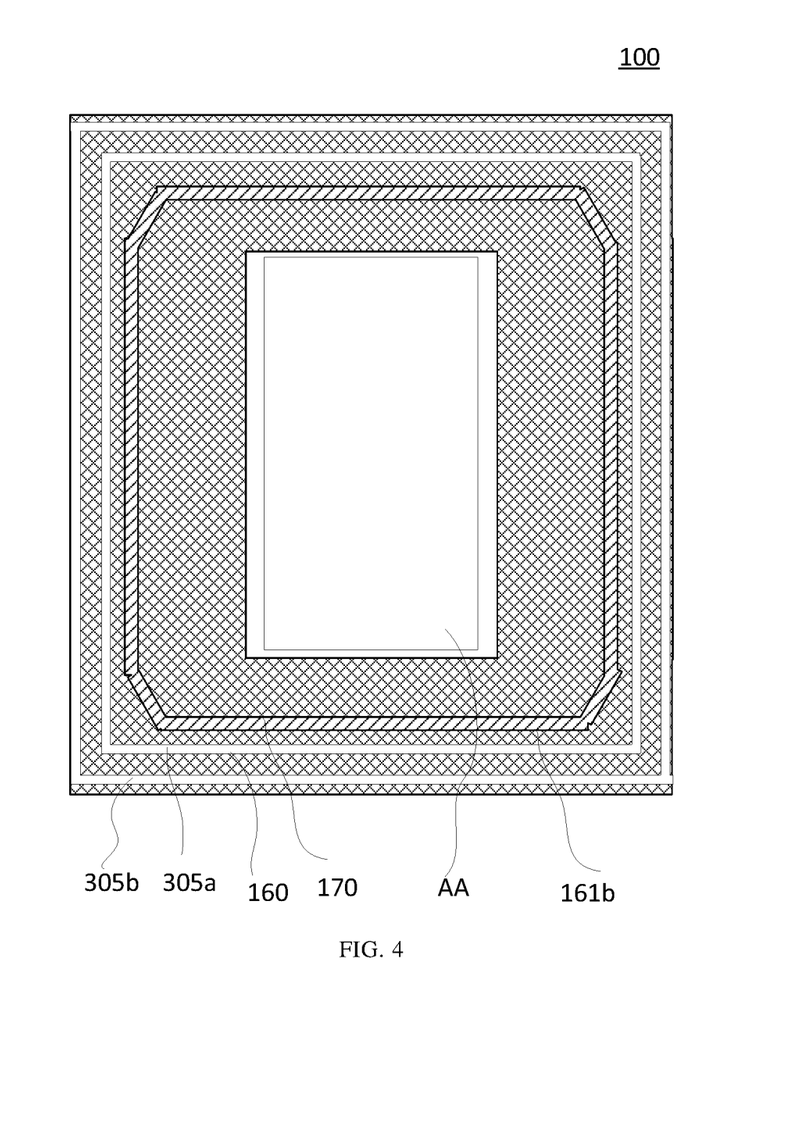
FIG. 4 is a schematic diagram showing a display panel according to another embodiment of the present disclosure.

Referring to FIGS. 2 and 4, FIG. 4 is a schematic diagram showing a display panel according to another embodiment of the present disclosure. In the transition region TA, a plurality of the second through holes 161b are connected to each other and arranged surrounding the display region. Correspondingly, the first inorganic layer is also arranged surrounding the display region and covers the region exposed out of the second through hole 161b, so that the entire region forms a strong force between the first inorganic layer 301 and the inorganic contact layer 170, thereby reducing the risk of peeling off. It should be noted that the plurality of second through holes may be connected to each other and surround the display panel. However, the design of the lower step of the display panel requires consideration of the factor of fan-out line, and disconnection of the second through hole may occur. The present disclosure is not limited thereto. Furthermore, in order to ensure normal transmission of the cathode signal, the boundary of the cathode should be arranged between the bank 305 and the inorganic contact layer 170. At this time, the boundary of the cathode may be arranged between the second through hole 161b and the first sub-bank 305a. Since the second through holes 161b are arranged surrounding the display region, the signal connection layer is at least partially separated. If the boundary of the cathode is arranged between the display region and the second through holes 161b, the signal connection layer between the second through holes 161b and the first sub-bank 305a does not work. When the boundary of the cathode is arranged between the second through holes 161b and the first sub-bank 305a, the portion of the signal connection layer can serve to reduce the resistance, enhance the display effect, and reduce the power loss.

It should be noted that, although the through holes are connected to each other and arranged surrounding the display region in an embodiment, it is mainly considered that the width of the transition region is wide. However, the present disclosure is not limited thereto. In other embodiments, the plurality of first through holes of the drive circuit region may be connected to each other and arranged surrounding the display region. Alternatively, the plurality of third through holes in the gap region may be connected to each other and arranged surrounding the display region.

Figure 5:
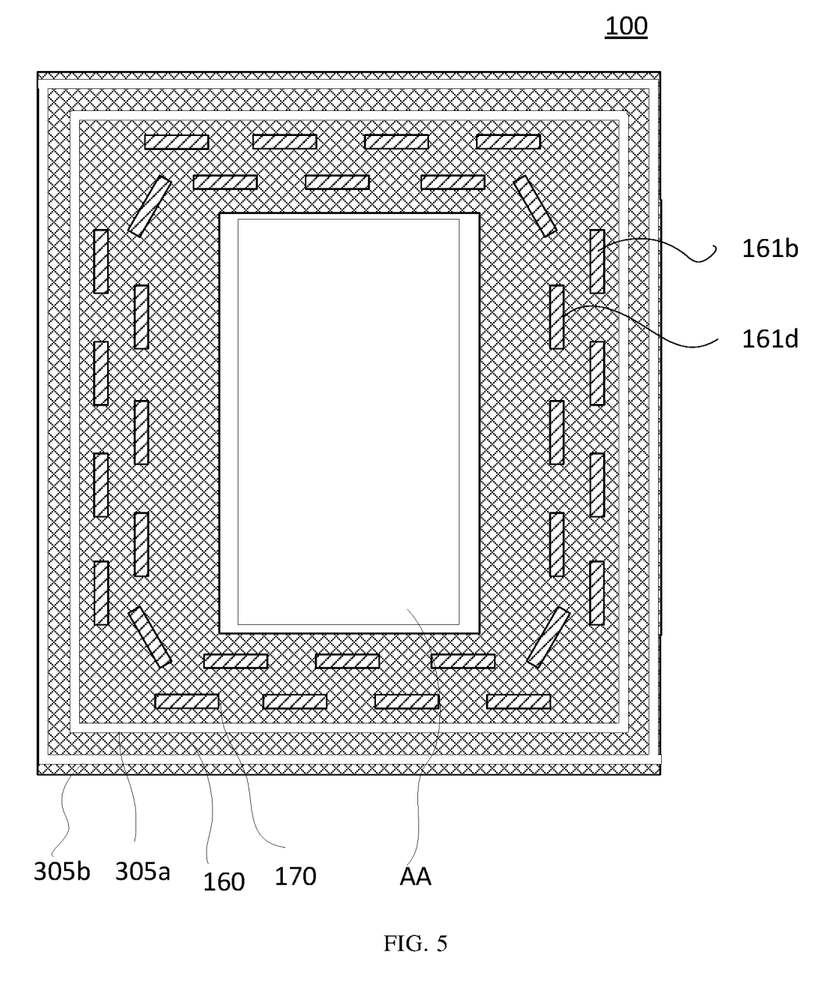
FIG. 5 is a schematic diagram showing a display panel according to another embodiment of the present disclosure.

Referring to FIGS. 2 and 5, FIG. 5 is a schematic diagram showing a display panel according to another embodiment of the present disclosure.

A plurality of the second through holes 161b in the transition region TA are spaced apart and arranged surrounding the display region. The signal of the first electrode is transmitted to the signal connection layer and then to the cathode through the power signal line, and providing the through holes in the signal connection layer may affect the signal transmission. In an embodiment, the plurality of through holes is arranged spacing apart, and the signal connection layer between the through holes can still transmit electrical signals, and the spacing is provided so that the signals surrounding the entire display panel are relatively uniform, and the display uniformity can also be improved.

At this time, the inorganic contact layer may also have an isolate-island structure, in which the separate isolate-islands of the plurality of inorganic contact layers cover each of the plurality of second through holes 161b.

It should be noted that, although the second through holes in the transition region TA are spaced apart and arranged surrounding the display region in an embodiment, it is mainly considered that the width of the transition region is wide. However, the present disclosure is not limited thereto. In other embodiments, the plurality of first through holes of the drive circuit region may be spaced apart and arranged surrounding the display region. Alternatively, the plurality of third through holes in the gap region may be spaced apart and arranged surrounding the display region.

Further, the first inorganic layer can be in contact with the inorganic contact layer due to the position of the second through holes 161b, the encapsulation effect is better. However, the encapsulation effect is relatively poor between two second through holes, and the peeling off phenomenon is likely to occur. In addition, water vapor and oxygen are also more likely to enter from weaker contact locations, causing failure of the encapsulation. In order to solve this problem, in an embodiment, a plurality of fourth through holes 161d of the signal connection layer is arranged spacing apart and arranged surrounding the display region. A spacing region is arranged between any adjacent two second through holes 161b. The plurality of fourth through holes 161d covers the spacing region in a direction perpendicular to an edge of the display region. The manner of alternative setting compensates for the deficiency of the encapsulation effect between the two second through holes 161b, so that the entire display panel does not have a region with weak encapsulation effect, further reducing the risk of peeling off of the flexible encapsulation layer.

It should be noted that, although the fourth through holes are arranged in the transition region TA and are spaced apart and arranged to cover the spacing region of the second through hole, it is mainly considered that the width of the transition region is wide. However, the present disclosure is not limited thereto. In other embodiments, a plurality of fifth through holes may be arranged in the drive circuit region and arranged to cover the spacing region of the first through holes to surround the display region. Alternatively, a plurality of sixth through holes may be arranged in the gap region and arranged to cover the spacing region of the first through holes. The present disclosure is not limited thereto.

Figure 6:
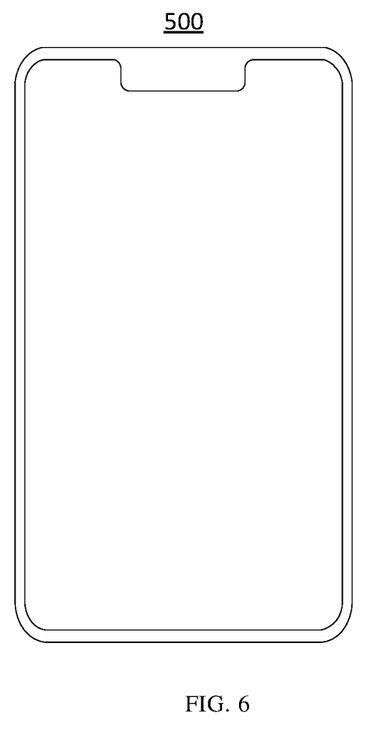
FIG. 6 is a schematic diagram showing a display device according to an embodiment of the present disclosure.

The present disclosure also discloses a display device. The display device according to the present disclosure may be any device including the drive unit as described above, including but not limited to a cellular mobile phone 500 as shown in FIG. 6, a tablet computer, a displayer of the computer, a displayer applied to a smart wearable device, a display device applied to vehicles such as automobiles, and the like. As long as the display device includes the drive unit included in the display device disclosed by the present disclosure, it is considered to fall into the protection scope of the present disclosure.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display panel, comprising:
   a base substrate;
   a power signal line over the base substrate;
   an inorganic contact layer over the power signal line;
   a signal connection layer over the inorganic contact layer;
   a first electrode over the signal connection layer;
   a flexible encapsulation layer comprising a first inorganic layer over the first electrode; and
   a display unit comprising a second electrode, the first electrode, and a light-emitting layer located between the first electrode the second electrode,
   wherein the signal connection layer is connected to the power signal line and the first electrode, the signal connection layer comprises a plurality of through holes and the first inorganic layer contacts the inorganic contact layer through the plurality of through holes, and
   wherein the signal connection layer and the second electrode are arranged in a same layer and made of a same material.

2. The display panel according to claim 1, wherein the display panel comprises a display region and a non-display region surrounding the display region; and the display panel further comprises a drive circuit having at least two metal layers;
   wherein the power signal line and the signal connection layer are located in the non-display region, and the power signal line and one of the at least two metal layers in the drive circuit are within a same layer and made of a same material.

3. The display panel according to claim 2, further comprising:
   a drive circuit region between the power signal line and the display region, wherein the signal connection layer comprises a first region overlapping with the drive circuit region, the first region comprises a plurality of first through holes, and the first inorganic layer is in contact with the inorganic contact layer by the plurality of first through holes.

4. The display panel according to claim 3, further comprising:
a first bank,
wherein the first inorganic layer covers at least a portion of the first bank, a transition region is between the first bank and the drive circuit, the signal connection layer comprises a second region overlapping with the transition region, the second region comprises a plurality of second through holes, and the first inorganic layer is in contact with the inorganic contact layer by the plurality of second through holes.

5. The display panel according to claim 4, wherein the first bank comprises a first sub-bank and a second sub-bank, a gap region is between the first sub-bank and the second sub-bank; and
the signal connection layer comprises a third region overlapping with the gap region, the third region comprises a plurality of third through holes, and the first inorganic layer is in contact with the inorganic contact layer through the plurality of third through holes.

6. The display panel according to claim 4, wherein the plurality of the second through holes is connected to each other and surrounds the display region.

7. The display panel according to claim 4, wherein the plurality of the second through holes is spaced apart from each other and surrounds the display region.

8. The display panel according to claim 7, further comprising:
a plurality of fourth through holes arranged on the signal connection layer,
wherein the plurality of fourth through holes is spaced apart from each other and arranged surrounding the display region; and
a spacing region is arranged between any two adjacent second through holes, and the fourth through hole covers the spacing region in a direction perpendicular to an edge of the display region.

9. The display panel according to claim 1, wherein the first inorganic layer comprises one or more of silicon nitride, silicon oxide, and silicon oxynitride; and
the inorganic contact layer comprises one or more of silicon nitride, silicon oxide, and silicon oxynitride.

10. The display panel according to claim 1, wherein the signal connection layer has a thickness less than 40 nm.

11. The display panel according to claim 1, wherein a sidewall of the through hole has an inclination angle less than 75° with respect to a top surface of the inorganic contact layer.

12. The display panel according to claim 1, wherein the inorganic contact layer has a plurality of isolate-island structures, and each of the plurality of isolate-island structures covers one of the plurality of through holes.

13. The display panel according to claim 1, wherein the flexible encapsulation layer further comprises an organic layer over the first inorganic layer; and
the flexible encapsulation layer further comprises a second inorganic layer over the organic layer.

14. A display panel, comprising:
a base substrate;
a power signal line over the base substrate;
an inorganic contact layer over the power signal line;
a signal connection layer over the inorganic contact layer;
a first electrode over the signal connection layer; and
a flexible encapsulation layer comprising a first inorganic layer over the first electrode,
wherein the signal connection layer is connected to the power signal line and the first electrode, the signal connection layer comprises a plurality of through holes and the first inorganic layer contacts the inorganic contact layer through the plurality of through holes, and
wherein the inorganic contact layer has a plurality of isolate-island structures, and each of the plurality of isolate-island structures covers one of the plurality of through holes.

* * * * *